United States Patent

Kandiah

[15] 3,688,208

[45] Aug. 29, 1972

[54] NEGATIVE FEEDBACK AMPLIFIER WITH HIGH SLEW RATE

[72] Inventor: Kathirkamathamby Kandiah, Abingdon, England

[73] Assignee: United Kingdom Atomic Energy Authority, London, S.W.1, England

[22] Filed: May 1, 1970

[21] Appl. No.: 33,562

[30] Foreign Application Priority Data

May 5, 1969 Great Britain..........22,912/69

[52] U.S. Cl. ....................330/13, 307/294, 328/151, 330/17, 330/28, 330/30 D

[51] Int. Cl. ..............................................H03f 3/18

[58] Field of Search .......330/13, 30 D, 17, 38 M, 28; 307/294, 313; 328/151, 127, 128

[56] References Cited

UNITED STATES PATENTS

| | | | |
|---|---|---|---|
| 3,336,518 | 8/1967 | Murphy | 328/151 X |
| 3,119,029 | 1/1964 | Russell | 328/127 X |
| 3,309,618 | 3/1967 | Harris et al. | 330/69 |
| 3,451,001 | 6/1969 | Foerster | 330/30 D |

OTHER PUBLICATIONS

Estep, " New Linear IC Amplifier Offers Flexibility," The Electronic Engineer April 1967, pp. 58- 60

Younge, " Bootstrapping Bias Supply Increases IC Voltage Capacity," Electronics, October 28, 1968, pp. 90, 91

*Primary Examiner*—Roy Lake

*Assistant Examiner*—James B. Mullins

*Attorney*—Larson, Taylor & Hinds

[57] ABSTRACT

Loop gain stability in a high gain electrical amplifier employing negative feedback is secured by incorporating a compensating capacitor. The rate of change of output (slew rate) under large signal conditions is increased, without forfeiting stability, by an emitter follower current amplifier incorporated in the circuit which supplies charging current to the compensating capacitor.

3 Claims, 3 Drawing Figures

Patented Aug. 29, 1972 3,688,208
PRIOR ART FIG. 1.
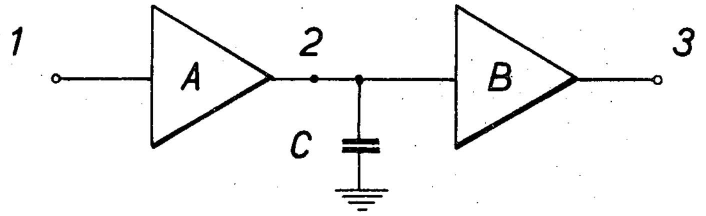
FIG. 2.
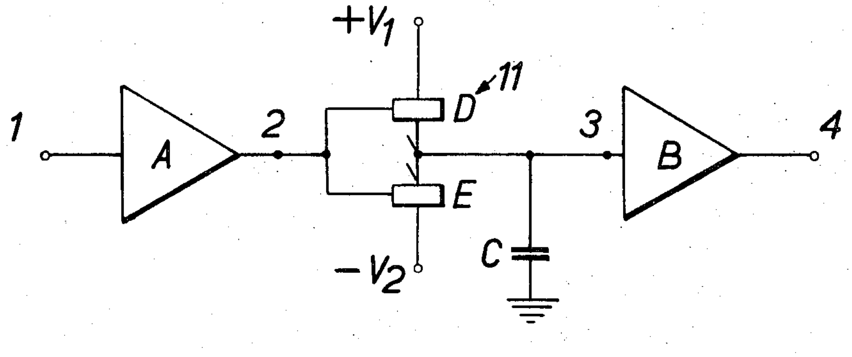
FIG. 3.
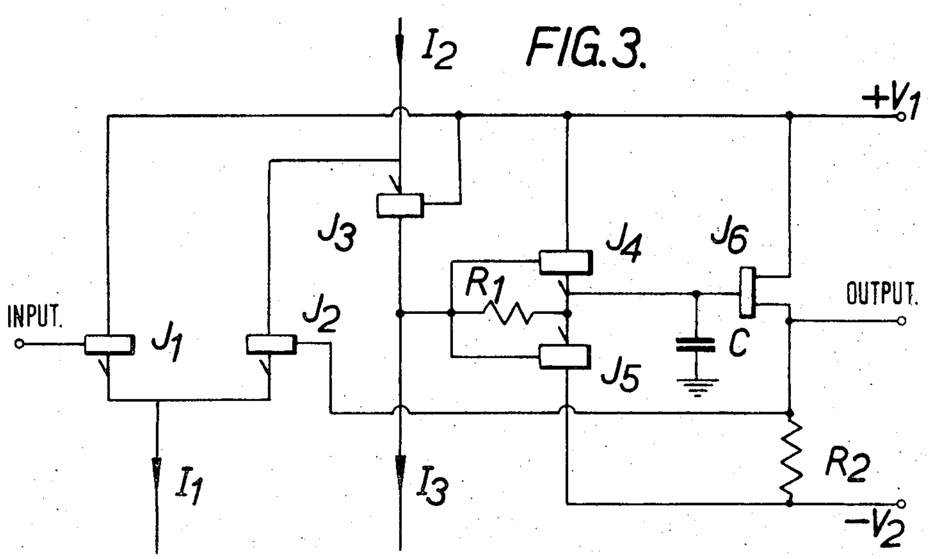

NEGATIVE FEEDBACK AMPLIFIER WITH HIGH SLEW RATE

BACKGROUND OF THE INVENTION

The invention relates to amplifiers.

High gain amplifiers using transistors and integrated circuits have wide application. They are particularly useful in operational amplifiers in which a large amount of negative feedback is applied in order to obtain well defined characteristics. Two important applications are in "sample and hold" circuits of high accuracy and in operational amplifiers for use in analogue to digital converters.

A major requirement in all amplifiers with negative feedback is that the gain at high frequencies should fall off in a controlled manner in order that the system has a monotonic response and is free from overshoots, rings and oscillations with feedback applied. The higher the internal gain the more difficult it becomes to meet this condition.

One method of achieving the necessary fall off of gain at high frequencies is to use one dominant lag by incorporating a compensating capacitor at a suitable point in the amplifier. This configuration will usually enable varying amounts of feedback to be applied when an adequately large capacitor is employed. The main disadvantage of this method is that under large signal conditions the rate of change of output (slew rate) is limited by the current available to charge and discharge the compensating capacitor.

The invention is based upon the appreciation that, by incorporation current amplifying means in the circuit which supplies charging current to the compensating capacitor, the slew rate can be increased without losing the loop gain stability provided by the capacitor.

SUMMARY OF THE INVENTION

The invention provides an electrical signal amplifier including a compensating capacitor connected to derive charging current from an electrical signal at a stage in its passage through the amplifier, the compensating capacitor being adapted and arranged to maintain loop gain stability of the amplifier under the desired operating conditions, the charging current for the compensating capacitor being supplied by current amplifying means arranged to provide current amplification dependent upon the difference between the electrical signal voltage at the input of the current amplifying means and the voltage appearing across the capacitor.

Preferably the current amplifying means is a balanced arrangement for providing current amplification of both charging and discharging currents to the compensating capacitor, the current amplification in both cases being dependent upon the difference between the electrical signal voltage at the input of the current amplifying means and the voltage appearing across the capacitor.

The invention further provides an electrical signal amplifier stage in which the output is connected to the bases of respectively an npn transistor and a pnp transistor, the emitters of the transistors being connected to one electrode of a capacitor whose other electrode is connected to earth, the collectors of the npn and pnp transistors being connected respectively to a positive and a negative voltage supply line, and the said one electrode of the capacitor comprising the output of the amplifier stage. Typically this output is connected to the next stage of the amplifier.

DESCRIPTION OF PREFERREd EMBODIMENTS

Specific constructions of amplifier embodying the invention will now be described by way of example and with reference to the accompanying drawings in which:

FIG. 1 is a diagrammatic illustration of a conventional amplifier,

FIG. 2 is a diagrammatic illustration of an amplifier embodying the invention,

FIG. 3 is a circuit diagram of part of a "sample and hold" circuit embodying the invention. Referring to FIG. 1, the amplifier has input terminal 1, output terminal 3 and consists of two parts labelled A and B with a lag or compensating capacitor C connected between earth and terminal 2. The complete amplifier of course consists of parts A and B together.

FIG. 2 shows an arrangement, in accordance with the invention, in which, by comparison with the FIG. 1 arrangement, a current amplifying means 11 is connected between the output 2 of the first part A of the amplifier and the capacitor C, the output of the current amplifying means 11 being also connected to the input 3 of part B of the amplifier. The current amplifying means 11 of this example comprises two emitter follower connected transistors D and E which are respectively npn and pnp. The collectors of D and E are connected respectively to supply lines at $+V_1$ volts and $-V_2$ volts.

In operation, if point 2 swings positive so as to forward bias transistor D, current will be fed into capacitor C until transistor D cuts-off when C will be charged up to substantially the same voltage as point 2. However, the rate of charging up of C, that is the slewing rate, is increased by the current gain of the transistor D. The operation of transistor E is equivalent for negative swings of the output voltage at point 2.

It will be appreciated that the arrangement is such that the permissible voltage swing at the output 2 of part A is sufficient to forward bias the emitter followers.

A sample and hold circuit using a high gain amplifier is shown in FIG. 3. In the first instance, if we ignore the sample and hold feature, the amplifier consists of a long tailed pair using transistors $J_1$ and $J_2$, a common base transistor $J_3$, the emitter followers $J_4$ and $J_5$ providing the improved slew rate as described above for the lag or compensating capacitor C and a source follower $J_6$. Negative feedback is provided from the output to the base of $J_2$. The nearly constant currents $I_1$, $I_2$ and $I_3$ can be provided by resistors or, when high performance is required, by further transistors. The forward gain at low frequencies will be high if the constant current $I_3$ is obtained with a transistor.

Using currents of 1mA in each of the transistors $J_1$, $J_2$ and $J_3$, a typical value for the lag or compensating capacitor will be about 1,000 pF giving a slew rate of about 1 volt/microsecond without the transistors $J_4$ and $J_5$ and typically better than 50 volt/microsecond with these transistors in the circuit as shown.

When the circuit in FIG. 3 is to be used as a sample and hold unit the currents $I_1$, $I_2$ and $I_3$ are turned on for sampling by external circuits thus providing a high loop gain amplifier with an external gain of 1 for charging the capacitor C which also acts as the storage capacitor. When the currents are cut off the circuit goes into the hold mode and retains the output voltage with a droop determined by leakage currents in the transistors. In order to eliminate increased droop due to leakage currents being amplified by $J_4$ and $J_3$, a high value resistor $R^1$, say 10 kilohms, is connected between the bases and emitters of these transistors.

It will be appreciated that the circuit of FIG. 3, when steady currents $I_2$ and $I_3$ are turned on, is effectively an operational amplifier with an external gain of 1.

Where it is desired to employ the minimum capacity in the circuit compatible with maintaining loop gain stability, a difficulty at low external gain is introduced by the change in characteristic of the transistors $J_1$ and $J_2$ as they approach their cut-off frequency. The difficulty may be circumvented by replacing the capacitor C with a series resistor-capacitor combination. The resistor will be of low resistance such that the resistor-capacitor combination is resonant at or near the cut-off frequency of transistors $J_1$ and $J_2$. In a more complex amplifier involving more transistors, the choice of resistor-capacitor combination will be a compromise to meet the differing cut-off frequencies of the various transistors involved.

The invention is not restricted to the details of the foregoing examples.

I claim:

1. A negative feedback electrical signal amplifier including a compensating capacitor for maintaining loop gain stability, said amplifier comprising a plurality of amplifier stages, and the output of one stage other than the final stage being connected to at least one current amplifying device having a control current path and a controlled current path, means for connecting the control current path to supply current to the compensating capacitor from an electrical signal at a stage in the passage of the signal through the amplifier, means for connecting the controlled current path between an external source of current and the said compensating capacitor, a resistor connected to said compensating capacitor in parallel with the control current path for stabilizing the supply of low current levels to the compensating capacitor, and a feedback loop connected between the output of said amplifier and a stage preceding said compensating capacitor, said compensating capacitor including first and second terminals, said first terminal being connected to a reference voltage level and said second terminal being connected to receive charging current from the said current amplifying device.

2. A negative feedback electrical signal amplifier as claimed in claim 1, wherein there is provided a balanced pair of said current amplifying devices, the control current paths of both devices being unidirectional and connected between the compensating capacitor and a source of electrical signal at a stage in the passage of the signal through the amplifier, the controlled current path of one device being connected between an external source of current and the said compensating capacitor, the controlled current path of the other device being connected between an external current sink and the said compensating capacitor, said resistor being connected in parallel with the control current paths for stabilizing the flow of low current levels to or from the compensating capacitor.

3. A negative feedback electrical signal amplifier including a compensating capacitor for maintaining loop gain stability, which amplifier comprises a plurality of amplifier stages, the output of one stage other than the final stage being connected to the bases of both an npn transistor and a pnp transistor, the emitters of the transistors being connected to one electrode of a capacitor whose other electrode is connected to ground, the collectors of the npn and pnp transistors being connected respectively to a positive and a negative voltage supply line, a resistor being connected between the said one electrode and the bases of the npn and pnp transistors for stabilizing the low current operating characteristic, the said one electrode of the capacitor comprising the output of the stage which is connected to the input of the next successive stage of the amplifier, and a feedback loop connecting the output of the amplifier to a stage preceding the compensating capacitor.

* * * * *